US012805305B2

(12) United States Patent
Jeong et al.

(10) Patent No.: US 12,805,305 B2
(45) Date of Patent: Nov. 17, 2026

(54) SEMICONDUCTOR DEVICE HAVING HIGH-VOLTAGE ISOLATION CAPACITOR

(71) Applicant: SK keyfoundry Inc., Cheongju-si (KR)

(72) Inventors: Jong Yeul Jeong, Cheongju-si (KR); Jeong Ho Sheen, Cheongju-si (KR); Sang Geun Koo, Cheongju-si (KR); Kang Sup Shin, Cheongju-si (KR)

(73) Assignee: SK keyfoundry Inc., Cheongju-si (KR)

( * ) Notice: Subject to any disclaimer, the term of this patent is extended or adjusted under 35 U.S.C. 154(b) by 882 days.

(21) Appl. No.: 18/188,856

(22) Filed: Mar. 23, 2023

(65) Prior Publication Data

US 2024/0063112 A1 Feb. 22, 2024

(30) Foreign Application Priority Data

Aug. 18, 2022 (KR) ........................ 10-2022-0103270

(51) Int. Cl.
*H10W 20/40* (2026.01)
*H10W 20/42* (2026.01)
*H10W 20/47* (2026.01)

(52) U.S. Cl.
CPC ......... *H10W 20/496* (2026.01); *H10W 20/47* (2026.01); *H10W 20/42* (2026.01)

(58) Field of Classification Search
CPC . H10W 20/42; H10W 20/496; H10W 20/435; H10W 20/47; H10W 20/495; H10W 72/90; H10W 72/59; H10W 44/601
See application file for complete search history.

(56) References Cited

U.S. PATENT DOCUMENTS

| | | | | |
|---|---|---|---|---|
| 6,459,562 B1 * | 10/2002 | KarRoy | H10W 20/077 | 257/295 |
| 2008/0277761 A1 | 11/2008 | Mahalingam et al. | | |
| 2012/0187536 A1 | 7/2012 | Dunn et al. | | |
| 2015/0333055 A1 | 11/2015 | West et al. | | |
| 2016/0163785 A1 | 6/2016 | West et al. | | |
| 2016/0172434 A1 * | 6/2016 | West | H10D 1/042 | 438/396 |

(Continued)

FOREIGN PATENT DOCUMENTS

JP 2013-191764 A 9/2013

OTHER PUBLICATIONS

German Office Action issued on Mar. 13, 2024, in counterpart German Patent Application No. 10 2023 119 200.0 (9 pages in English, 9 pages in German).

(Continued)

*Primary Examiner* — John M Parker
(74) *Attorney, Agent, or Firm* — NSIP Law

(57) ABSTRACT

A semiconductor device including a high-voltage isolation capacitor and a mixed-signal integrated circuit, wherein the high-voltage isolation capacitor includes bottom electrodes, each spaced apart from another, disposed on a substrate; top electrodes disposed on corresponding ones of the bottom electrodes; an inter-metal dielectric layer disposed between the bottom electrodes and the top electrodes; and low bandgap dielectric layers disposed on the inter-metal dielectric layer. Each of the low bandgap dielectric layers is disposed below corresponding ones of the top electrodes, and the low bandgap dielectric layers are absent in the mixed-signal integrated circuit.

15 Claims, 6 Drawing Sheets

(56) References Cited

U.S. PATENT DOCUMENTS

| | | | | |
|---|---|---|---|---|
| 2017/0263696 | A1 | 9/2017 | West et al. | |
| 2019/0074350 | A1 | 3/2019 | West et al. | |
| 2019/0206981 | A1 | 7/2019 | Bonifield et al. | |
| 2019/0378892 | A1 | 12/2019 | Stewart et al. | |
| 2020/0075229 | A1 | 3/2020 | Sawahara | |
| 2020/0312794 | A1 | 10/2020 | West et al. | |
| 2021/0225756 | A1 | 7/2021 | Yu et al. | |
| 2022/0044997 | A1* | 2/2022 | Yu | H10D 1/692 |

OTHER PUBLICATIONS

Korean Office Action issued on Sep. 26, 2024, in counterpart Korean Patent Application No. 10-2022-0103270 (7 pages in English, 6 pages in Korean).

* cited by examiner

SEMICONDUCTOR DEVICE HAVING HIGH-VOLTAGE ISOLATION CAPACITOR

CROSS-REFERENCE TO RELATED APPLICATIONS

This application claims the benefit under 35 USC 119(a) of Korean Patent Application No. 10-2022-0103270, filed on Aug. 18, 2022, in the Korean Intellectual Property Office, the entire disclosure of which is incorporated herein by reference for all purposes.

BACKGROUND

1. Field

The following description relates to a semiconductor device having a high-voltage isolation capacitor.

2. Description of Related Art

Digital Isolators electrically separate circuits but allow digital signals to be transferred between them, and support high-voltage isolation ratings up to 5 kV. Digital isolators use transformers or capacitors to magnetically or capacitively couple data across an isolation barrier. Capacitive isolation employs high-voltage isolation capacitors to couple data signals across the isolation barrier. An isolation barrier using a thick oxide interlayer insulating film may be incorporated into the high-voltage isolation capacitors in a semiconductor device to obtain the high-voltage isolation. However, it is difficult to increase the high-voltage isolation by merely increasing the thickness of the thick oxide interlayer insulating film. Low bandgap materials having a bandgap lower than the thick oxide interlayer insulating film may be incorporated into the high-voltage isolation capacitors to increase the high-voltage isolation.

Employing lower bandgap materials may induce undesired leakage current in a semiconductor device's mixed analog-digital circuit region. An integration process with the high-voltage isolation capacitors may be desired to reduce the leakage current in the mixed analog-digital circuit region.

The above information is presented as background information only to assist with an understanding of the present disclosure. No determination has been made, and no assertion is made, as to whether any of the above might be applicable as prior art with regard to the disclosure.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a semiconductor device including a high-voltage isolation capacitor and a mixed-signal integrated circuit, wherein the high-voltage isolation capacitor includes: bottom electrodes, each spaced apart from another, disposed on a substrate; top electrodes disposed on corresponding ones of the bottom electrodes; an inter-metal dielectric layer disposed between the bottom electrodes and the top electrodes; and low bandgap dielectric layers disposed on the inter-metal dielectric layer. Each of the low bandgap dielectric layers is disposed below corresponding ones of the top electrodes, and the low bandgap dielectric layers are absent in the mixed-signal integrated circuit.

The mixed-signal integrated circuit may include a bottom metal line disposed adjacent the bottom electrodes; an inter-metal line disposed on the bottom metal line; a via connected to the inter-metal line; and a top metal line connected with the via, wherein the low bandgap dielectric layers are absent below the top metal line.

The semiconductor device may further include a passivation layer disposed in direct contact with the low bandgap dielectric layers and the top electrodes.

A top surface of the via may be coplanar with bottom surfaces of the low bandgap dielectric layers.

A bottom surface of the top metal line may include disposed lower than a bottom surface of the top electrode, and the bottom surface of the top metal line may include disposed lower than a top surface of the via.

Each of the low bandgap dielectric layers may include a first sub-low bandgap dielectric layer having a first thickness, and a second sub-low bandgap dielectric layer having a second thickness greater than the first thickness.

Each of the low bandgap dielectric layers may have a bandgap lower than a bandgap of the inter-metal dielectric layer.

In another general aspect, a semiconductor device including a high-voltage isolation capacitor and a mixed-signal integrated circuit, wherein the high-voltage isolation capacitor includes; bottom electrodes, each spaced apart from another, disposed on a substrate; top electrodes disposed on corresponding ones of the bottom electrodes; an inter-metal dielectric layer disposed between the bottom electrodes and the top electrodes; and a single low bandgap dielectric layer disposed between the inter-metal dielectric layer and each one of the top electrodes. The single low bandgap dielectric layer is absent in the mixed-signal integrated circuit.

The mixed-signal integrated circuit may include a bottom metal line disposed adjacent the bottom electrodes; an inter-metal line disposed on the bottom metal line; a via connected to the inter-metal line; and a top metal line connected with the via, wherein a bottom surface of the top metal line is disposed lower than a bottom surface of the top electrode.

The bottom surface of the top metal line may be disposed lower than a top surface of the via.

The low bandgap dielectric layer may include a first sub-low bandgap dielectric layer having a first thickness; and a second sub-low bandgap dielectric layer having a second thickness greater than the first thickness.

In another general aspect, a semiconductor device, includes a mixed-signal integrated circuit region, and a high-voltage isolation capacitor region. The high-voltage isolation capacitor region includes bottom electrodes, each spaced apart from another, disposed on a substrate; top electrodes disposed on corresponding ones of the bottom electrodes; an inter-metal dielectric layer disposed between the bottom electrodes and the top electrodes; and low bandgap dielectric layers, each disposed between corresponding ones of the top electrodes and the inter-metal dielectric layer. The mixed-signal integrated circuit region includes a top metal line disposed directly on the inter-metal dielectric layer.

The mixed-signal integrated circuit region further may include a bottom metal line disposed adjacent the bottom electrodes; an inter-metal line disposed on the bottom metal line; and a via connected to the inter-metal line. The top metal line may be connected with the via.

The semiconductor device may further include a passivation layer disposed in direct contact with the low bandgap dielectric layers and the top electrodes.

A top surface of the via may be coplanar with bottom surfaces of the low bandgap dielectric layers.

A bottom surface of the top metal line may be disposed lower than a bottom surface of the top electrode, and the bottom surface of the top metal line may be disposed lower than a top surface of the via.

Each of the low bandgap dielectric layers may include a first sub-low bandgap dielectric layer having a first thickness, and a second sub-low bandgap dielectric layer having a second thickness greater than the first thickness.

Each of the low bandgap dielectric layers may have a bandgap lower than a bandgap of the inter-metal dielectric layer.

Other features and aspects will be apparent from the following detailed description, the drawings, and the claims.

BRIEF DESCRIPTION OF DRAWINGS

Throughout the drawings and the detailed description, the same reference numerals refer to the same or like elements. The drawings may not be to scale, and the relative size, proportions, and depiction of elements in the drawings may be exaggerated for clarity, illustration, and convenience.

DETAILED DESCRIPTION

Figure 1:
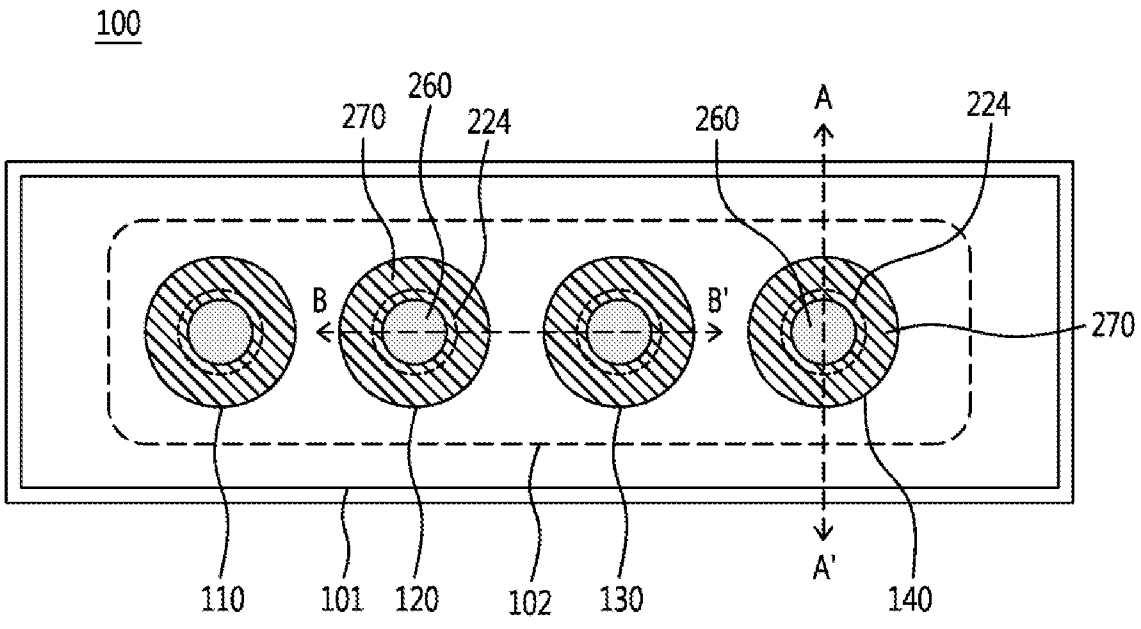
FIG. 1 illustrates a top view of a semiconductor device having a high-voltage isolation capacitor in accordance with one or more examples of the present disclosure.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after understanding of the disclosure of this application may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As implemented herein, the term "and/or" includes any one and any combination of any two or more of the associated listed items.

Although terms such as "first," "second," and "third" may be implemented herein to describe various members, components, regions, layers, or sections, these members, components, regions, layers, or sections are not to be limited by these terms. Rather, these terms are only implemented to distinguish one member, component, region, layer, or section from another member, component, region, layer, or section. Thus, a first member, component, region, layer, or section referred to in examples described herein may also be referred to as a second member, component, region, layer, or section without desurfaceing from the teachings of the examples.

Spatially relative terms such as "above," "upper," "below," and "lower" may be implemented herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms implemented herein are to be interpreted accordingly.

The terminology implemented herein is for describing various examples only, and is not to be implemented to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 illustrates a top view of a semiconductor device having a high-voltage isolation capacitor in accordance with one or more examples of the present disclosure.

Referring to FIG. 1, a semiconductor device 100, in accordance with one example, may include a mixed-signal integrated circuit region 101 and a high-voltage isolation capacitor region 102. A mixed-signal integrated circuit is an integrated circuit that has both analog circuits and digital circuits on a single semiconductor die. The mixed-signal integrated circuit region 101 may have a mixed-signal integrated circuit or a digital signal processing circuit. The high-voltage isolation capacitor region 102 may have a capacitive isolation or a high-voltage isolation capacitor. The high-voltage isolation capacitor region 102 is designed to have a high-voltage isolation capable structure.

The high-voltage isolation capacitor region 102 may include a plurality of high-voltage isolation capacitors 110, 120, 130 and 140. Each of the high-voltage isolation capacitors 110, 120, 130 and 140 may comprise a bottom electrode 224, a top electrode 260, and inter-metal dielectric layers (not shown) as an isolation barrier disposed between the bottom electrode 224 and the top electrode 260. Furthermore, the high-voltage isolation capacitor region 102 includes a low bandgap dielectric layer 270 disposed on the inter-metal dielectric layers. The low bandgap dielectric layer 270 is disposed under the top electrode 260 and may extend outside of the top electrode 260. In an example, the low bandgap dielectric layer 270 may comprise SiON or SiOC, silicon rich oxide, SiN or SiCN, silicon rich nitride, etc.

Each bottom electrode 224 is spaced apart from a neighboring bottom electrode 224. Similarly, each top electrode 260 is spaced apart from a neighboring top electrode 260. The top electrodes 260 spaced apart from each other may be advantageous to digital signal transmission with high frequency.

Each low bandgap dielectric layer 270 is separated from a neighboring low bandgap dielectric layer 270 in the high-voltage isolation capacitor region 102. However, no low bandgap dielectric layer is disposed in the mixed-signal integrated circuit region 101. If a low bandgap dielectric layer 270 is disposed in the mixed-signal integrated circuit region 101, excessive leakage current may occur in the mixed-signal integrated circuit region 101.

Figure 2:
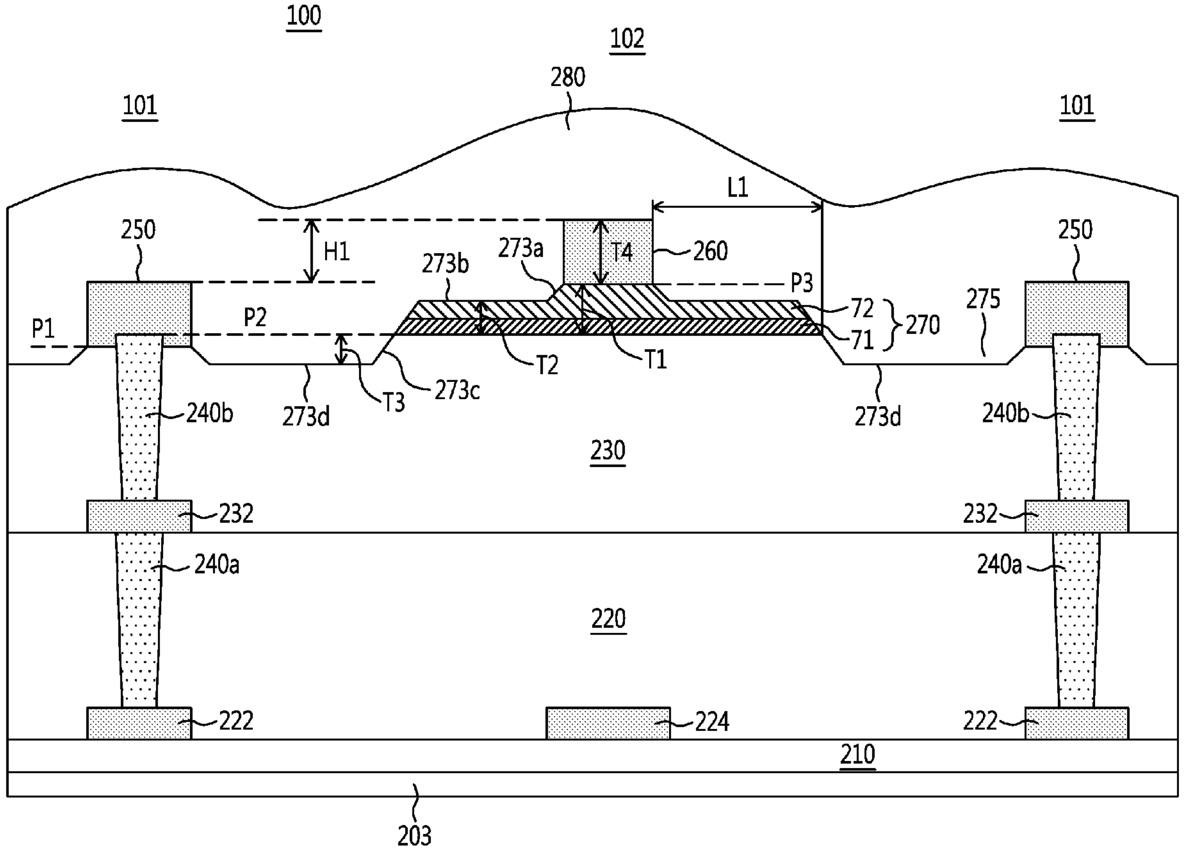
FIG. 2 illustrates a cross-sectional view of the semiconductor device having a high-voltage isolation capacitor, according to the line A-A' in FIG. 1, in accordance with one or more examples of the present disclosure.

FIG. 2 illustrates a cross-sectional view of the semiconductor device having a high-voltage isolation capacitor according to the line A-A' in FIG. 1 in accordance with one or more examples of the present disclosure.

Referring to FIG. 2, the semiconductor device 100, in accordance with one or more examples of the present disclosure, includes the mixed-signal integrated circuit region 101 and the high-voltage isolation capacitor region 102. The mixed-signal integrated circuit region 101 includes first, second, and third inter-metal dielectric layers 210, 220, 230 disposed on a substrate 203; a bottom metal line 222; a first via 240*a* disposed on the bottom metal line 222; an inter-metal line 232 disposed on the first via 240*a*; a second via 240*b* disposed on the inter-metal line 232; and a top metal line 250 connected to the second via 240*b*. The third inter-metal dielectric layer 230 refers to a topmost inter-metal dielectric layer 230. The second via 240*b* may also refer to a top via 240*b*.

The high-voltage isolation capacitor region 102 includes the first inter-metal dielectric layer 210; a bottom electrode 224 disposed along with the bottom metal line 222; the second and third inter-metal dielectric layers 220, 230 disposed on the bottom electrode 224; and a low bandgap dielectric layer 270 disposed on the third inter-metal dielectric layer 230. The low bandgap dielectric layer 270 may comprise a material different from materials of the second and third inter-metal dielectric layers 220, 230.

The high-voltage isolation capacitor region 102 further includes a top electrode 260 disposed on the low bandgap dielectric layer 270, and a passivation layer 280. The passivation layer 280 is disposed on the low bandgap dielectric layer 270, the top metal line 250, and the top electrode 260. The passivation layer 280 may directly contact a portion of the low bandgap dielectric layer 270, the top metal line 250, and the top electrode 260. In addition, the passivation layer 280 may be implemented by stacking SiO2/SiN insulating films.

The low bandgap dielectric layer 270 may have a similar height to the top metal line 250. A portion of the low bandgap dielectric layer 270 may parallel the top metal line 250. A bottom surface P1 of the top metal line 250 may be disposed lower than a bottom surface P2 of the low bandgap dielectric layer 270 and a top surface P2 of the second via 240*b*. The top surface P2 of the second via 240*b* and the bottom surface P2 of the low bandgap dielectric layer 270 may be formed at the same plane with respect to a horizontal direction.

The bottom surface P1 of the top metal line 250 may also be disposed lower than the bottom surface P3 of the top electrode 260. A height difference H1 between the top surface of the top electrode 260 and the top surface of the top metal line 250 is at least greater than a first thickness T1 of the low bandgap dielectric layer 270. Furthermore, a length L1 of the low bandgap dielectric layer 270 that horizontally extends beyond the top electrode 260 may be greater than a fourth thickness T4 of the top electrode 260.

A first groove 275 may be formed in the third inter-metal dielectric layer 230. The first groove 275 may be formed after performing an etching process on the low bandgap dielectric layer 270 and the top electrode 260. The first groove 275 may be formed between the top electrode 260 and the neighboring top metal line 250. The low bandgap dielectric layer 270 is absent in the first groove 275. Furthermore, no low bandgap dielectric layer 270 is disposed under the top metal line 250 formed in the mixed-signal integrated circuit region 101. If the low bandgap dielectric layer 270 is formed under the top metal line 250, excessive leakage current may be generated in the mixed-signal integrated circuit region 101. Therefore, no low bandgap dielectric layer 270 is disposed under the top metal line 250 in the mixed-signal integrated circuit region 101. In other words, the top metal line 250 is in direct contact with the inter-metal dielectric layer 230 and the second via 240*b*.

Referring to FIG. 2, in the high-voltage isolation capacitor region 102, the passivation layer 280 is formed on the top electrodes 260. The passivation layer 280 may be in direct contact with the third inter-metal dielectric layer 230 through the first groove 275. A boundary 273*d* may be formed between the passivation layer and the third inter-metal dielectric layer 230.

The bottom electrode 224 may be formed of Ti, TiN, W, WN, Ta, TaN, Al, Cu, etc. The inter-metal dielectric layers 210, 220, 230 may be formed of TEOS oxide layer, BPSG oxide layer, HDP oxide layer, USG oxide layer, FSG oxide layer, SiOC, low-k, etc. The inter-metal dielectric layers 210, 220, 230 may include an etch stop layer of SiC, SiCN, SiN, SiOCN, etc.

The low bandgap dielectric layer 270 is formed between the top electrode 260 and the inter-metal dielectric layers 210, 220, 230. The low bandgap dielectric layer 270 may comprise a material different from materials of the inter-metal dielectric layers 210, 220, 230. In detail, the low bandgap dielectric layer 270 may comprise a material having a bandgap lower than the bandgaps of the inter-metal dielectric layers 210, 220, 230. The low bandgap dielectric layer 270 may help a digital signal easily transfer between the top electrode 260 and the bottom electrode 224.

Referring to FIG. 2, the low bandgap dielectric layer 270 includes at least two insulating layers—a first sub-low bandgap dielectric layer 71 and a second sub-low bandgap dielectric layer 72. The first sub-low bandgap dielectric layer 71 and the second sub-low bandgap dielectric layer 72 may be formed of different materials. For example, the first sub-low bandgap dielectric layer 71 may comprise SiON or SiOC, silicon rich oxide, etc., and the second sub-low bandgap dielectric layer 72 may comprise SiN or SiCN, silicon rich nitride, etc., or vice versa. So, a bandgap of the first sub-low bandgap dielectric layer 71 and a bandgap of the second sub-low bandgap dielectric layer may differ. For example, a bandgap of the first sub-low bandgap dielectric layer 71 may be greater than a bandgap of the second sub-low bandgap dielectric layer 72, or vice versa. The third inter-metal dielectric layer 230 may comprise silicon dioxide, SiO2, which has a bandgap of about 9. For example, if the second sub-low bandgap dielectric layer 72 comprises SiN, the bandgap will approximately be 5. In an example, the first sub-low bandgap dielectric layer 71 may have a bandgap lower than the second sub-low bandgap dielectric layer 72 and higher than the third inter-metal dielectric layer 230. Thus, the bandgap may decrease in the order of the bandgap of the third inter-metal dielectric layer being greater than the bandgap of the first sub-low bandgap dielectric layer 71 and being greater than the bandgap of the second sub-low bandgap dielectric layer 72. In another example, the bandgap of the first sub-low bandgap dielectric layer 71 may be less than that of the second sub-low bandgap dielectric layer 72. The bandgap may decrease as follows: third inter-metal dielectric layer>second sub-low bandgap dielectric layer 72>first sub-low bandgap dielectric layer 71.

The low bandgap dielectric layer 270 includes different zones with different inclination angles. In an example, the low bandgap dielectric layer 270 includes a first inclination zone **273*a*, a flat zone 273*b*, and a second inclination zone 273*c*. The first and second inclination zones 273*a*, 273*c* may have an inclination angle with a respect to a top surface of the substrate 203. Thus, the first and second inclination zones 273*a*, 273*c* may aid in the removal of polymer residues generated during the patterning process of the top electrode 260**.

Intermediate portions of the first sub-low bandgap dielectric layer 71 has an entirely uniform thickness. Conversely, the second sub-low bandgap dielectric layer 72 has a constant thickness under the top electrode 260, but a decreased thickness outside the top electrode 260. So, the low bandgap dielectric layer 270 may have two different thicknesses: a first thickness T1, and a second thickness T2. The second thickness T2 may be less than the first thickness T1. The thickness may depend on the position of the low bandgap dielectric layer 270.

Figure 3:
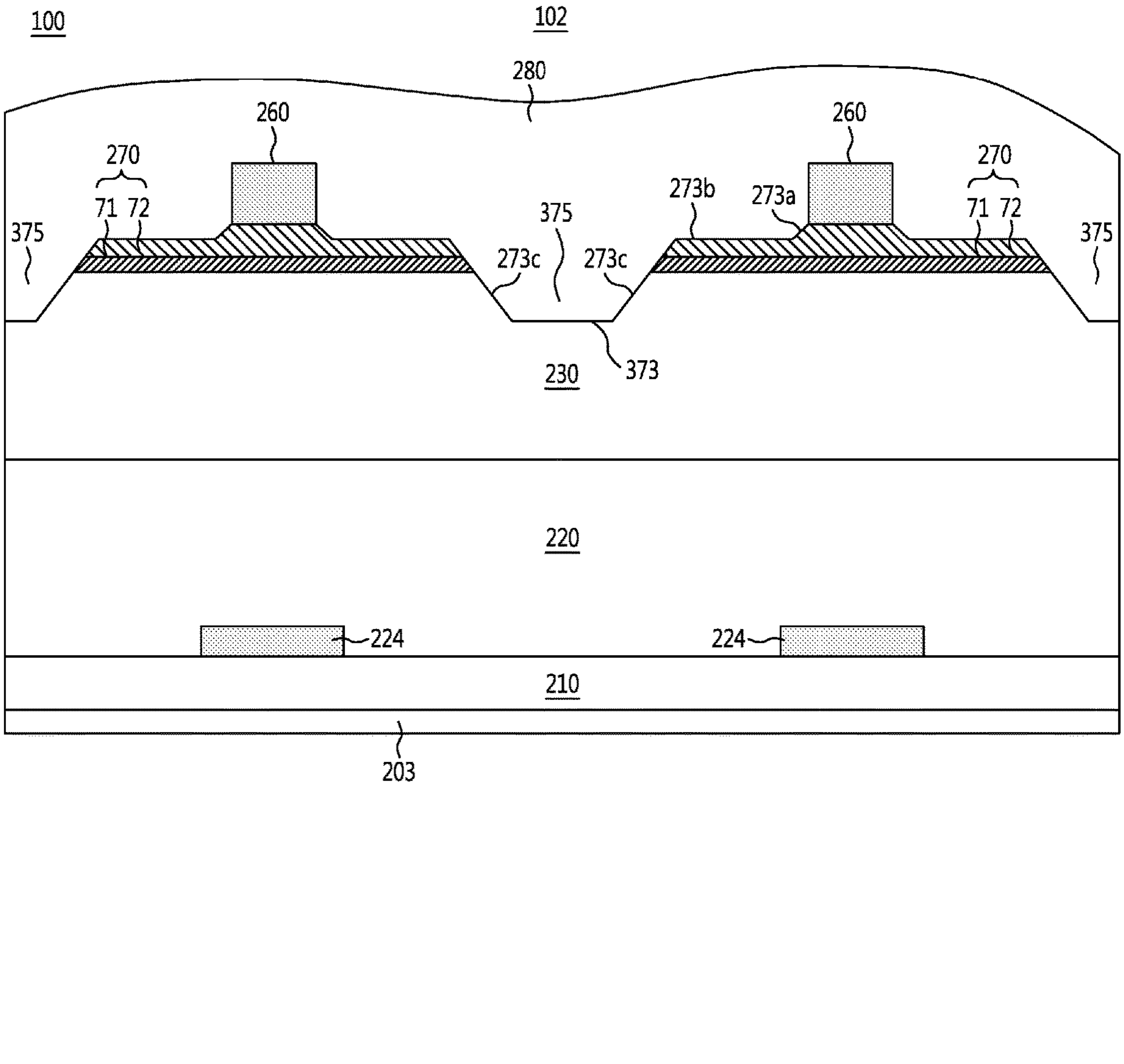
FIG. 3 illustrates a cross-sectional view of the semiconductor device having a high-voltage isolation capacitor, according to the line B-B' in FIG. 1, in accordance with one or more examples of the present disclosure.

FIG. 3 illustrates a cross-sectional view of the semiconductor device having a high-voltage isolation capacitor, according to the line B-B' in FIG. 1, in accordance with one or more examples of the present disclosure.

Referring to FIG. 3, the high-voltage isolation capacitor region 102 may include on the substrate 203, bottom electrodes 224, inter-metal dielectric layers 210, 220, 230, a low bandgap dielectric layer 270, top electrodes 260, and a passivation layer 280. A second groove 375 may be formed in the third inter-metal dielectric layer 230. The second groove 375 may be formed between a top electrode 260 and a neighboring top electrode 260. The low bandgap dielectric layer 270 is absent on the second groove 375, electrically separating a low bandgap dielectric layer 270 from a neighboring low bandgap dielectric layer 270.

Referring to FIG. 3, the passivation layer 280 may be formed on the top electrodes 260. The passivation layer 280 may be in direct contact with the third inter-metal dielectric layer 230 through the second etch groove 375. A boundary 373 may be formed between the passivation layer 280 may be formed between the third inter-metal dielectric layer 230.

Figure 4:
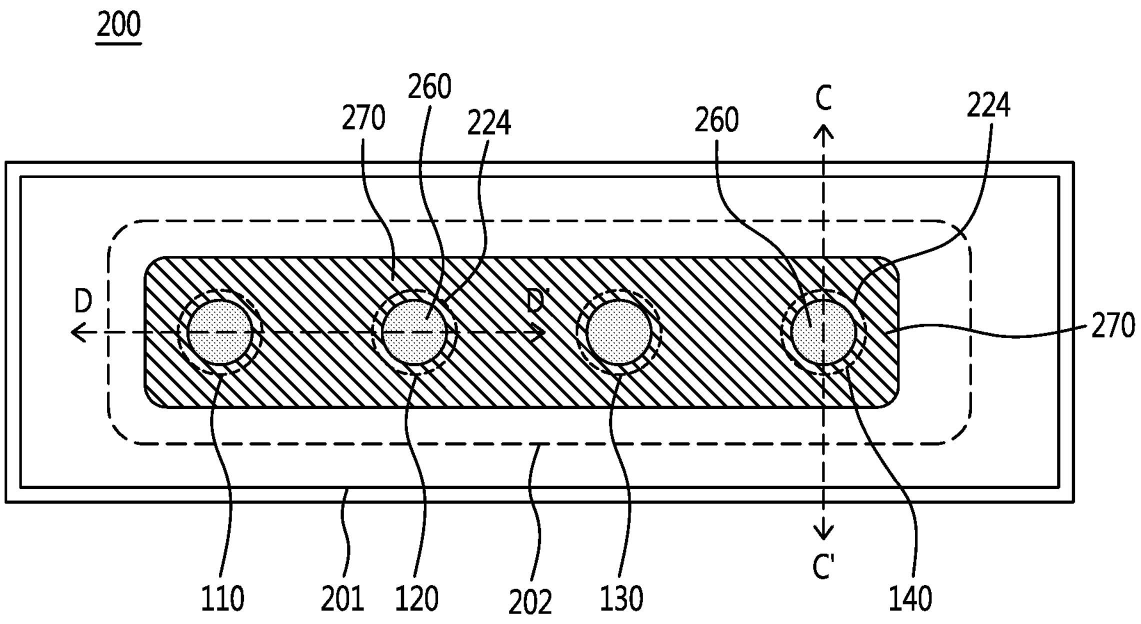
FIG. 4 illustrates a top view of a semiconductor device having a high-voltage isolation capacitor in accordance with another example of the present disclosure.

FIG. 4 illustrates a top view of a semiconductor device having a high-voltage isolation capacitor in accordance with another example of the present disclosure.

Referring to FIG. 4, a semiconductor device 200 may include a mixed-signal integrated circuit region 201 and a high-voltage isolation capacitor region 202 in accordance with one example. FIG. 4 is similar to FIG. 3, except for the low bandgap dielectric layer 270.

The low bandgap dielectric layer 270 has a continuous single layer enclosing the high-voltage isolation capacitors 110, 120, 130 and 140. The low bandgap dielectric layer 270 may also be disposed under the high-voltage isolation capacitors 110, 120, 130 and 140.

The high-voltage isolation capacitor region 202 includes high-voltage isolation capacitors 110, 120, 130 and 140. Each of the high-voltage isolation capacitors 110, 120, 130 and 140 may comprise a bottom electrode 224 and a top electrode 260. Each of the of the high-voltage isolation capacitors 110, 120, 130 and 140 is spaced apart from neighboring the high-voltage isolation capacitors 110, 120, 130 and 140.

Figure 5:
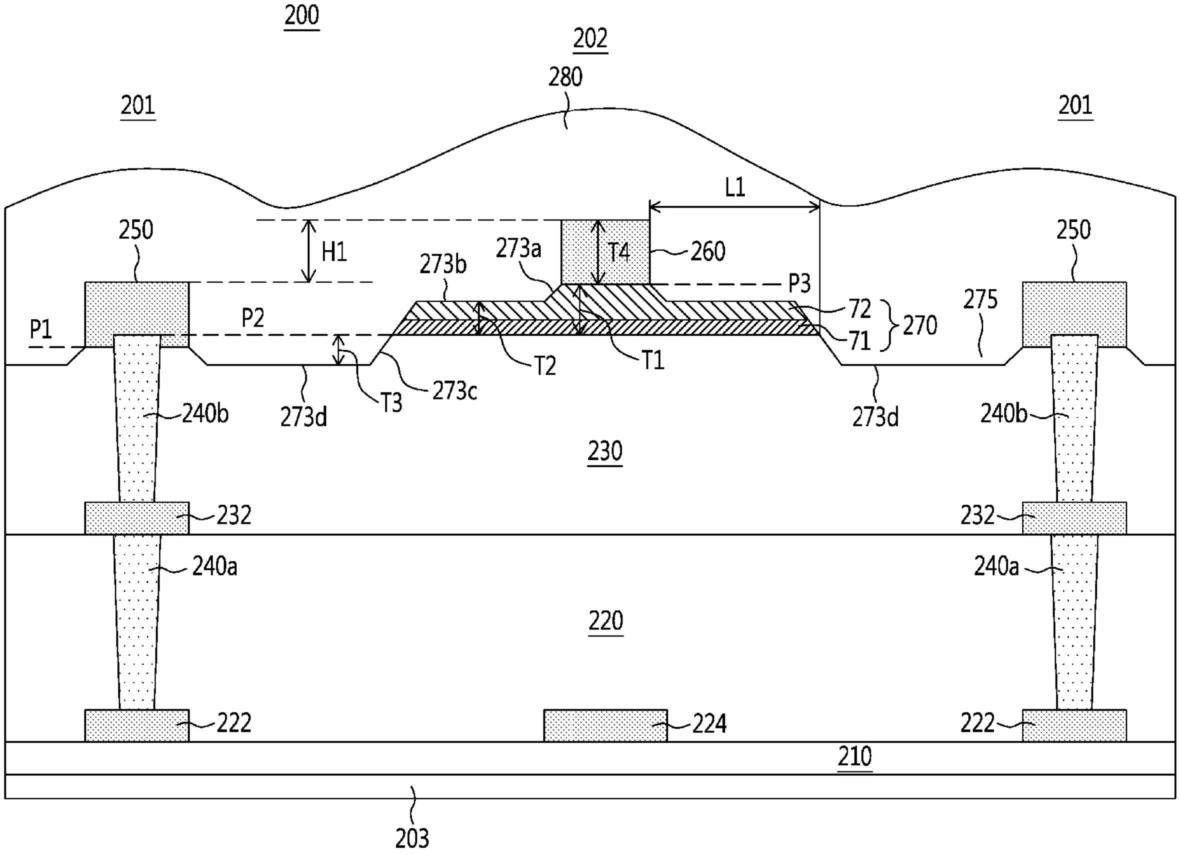
FIG. 5 illustrates a cross-sectional view of the semiconductor device having a high-voltage isolation capacitor, according to the line C-C' in FIG. 4, in accordance with another example of the present disclosure.

FIG. 5 illustrates a cross-sectional view of the semiconductor device having a high-voltage isolation capacitor, according to the line C-C' in FIG. 4, in accordance with another example of the present disclosure.

FIG. 5 is very similar to FIG. 2. A mixed-signal integrated circuit region 201 of the semiconductor device 200 includes a substrate 203, inter-metal dielectric layers 210, 220, 230 formed on the substrate 230, bottom metal lines 222, and a bottom electrode 224. The mixed-signal integrated circuit region 201 of the semiconductor device 200 further includes first vias **240*a* connected to the bottom metal lines 222; second vias 240*b* connected to the inter-metal lines 232; and top metal lines 250 connected to the second vias 240*b***.

The high-voltage isolation capacitor region 202 of the semiconductor device 200 includes: a low bandgap dielectric layer 270 that is formed on the third inter-metal dielectric layer 230 comprising a first sub-low bandgap dielectric layer 71 and a second sub-low bandgap dielectric layer 72; a top electrode 260 formed on the low bandgap dielectric layer 270; and a passivation layer 280 that is in contact with the top metal line 250 and the top electrode 260 and that covers the low bandgap dielectric layer 270, the top metal line 250, and the top electrode 260.

Since the low bandgap dielectric layer 270 has a similar height to the top metal line 250, it may parallel with the top metal line 250. The top surface P2 of the second via **240*b* may have a same plane as of the bottom surface P2 of the low bandgap dielectric layer 270. The bottom surface P3 of the top electrode 260 may be positioned higher than the bottom surface P1 of the top metal line 250. It can be seen that a height difference H1 between the top surface of the top electrode 260 and the top surface of the top metal line 250 is at least greater than a first thickness T1 of the low bandgap dielectric layer 270. Furthermore, a length L1 of the low bandgap dielectric layer 270 outside the top electrode 260 may be greater than a fourth thickness T4 of the top electrode 260**.

Figure 6:
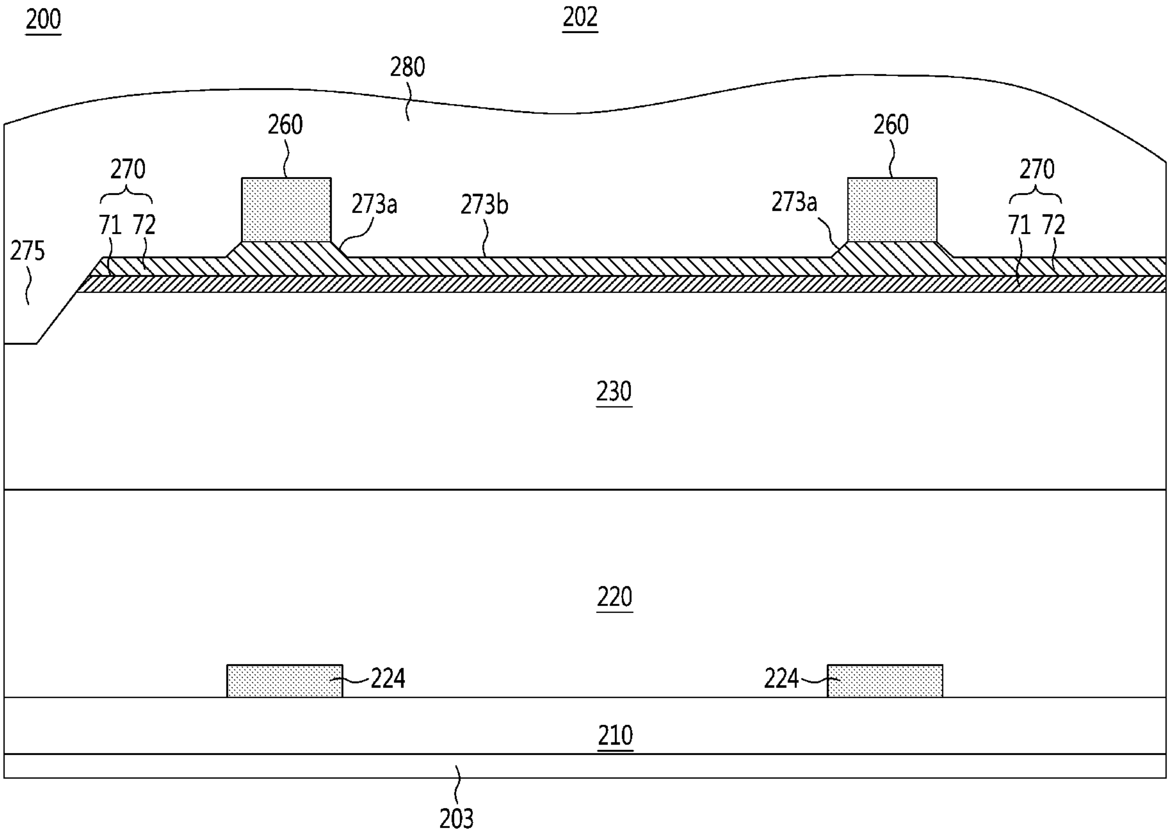
FIG. 6 illustrates a cross-sectional view of the semiconductor device having a high-voltage isolation capacitor, according to the line D-D' in FIG. 4, in accordance with another example of the present disclosure.

FIG. 6 illustrates a cross-sectional view of the semiconductor device having a high-voltage isolation capacitor, according to the line D-D' in FIG. 4, in accordance with another example of the present disclosure.

Referring to FIG. 6, a high-voltage isolation capacitor region 202 of the semiconductor device 200 in accordance with another example of the present disclosure may include on a substrate 203 a bottom electrode 224, inter-metal dielectric layers 210, 220, 230, a low bandgap dielectric layer 270, a top electrode 260, and a passivation layer 280. No grooves are formed between the top electrode 260 and neighboring other top electrodes 260. The continuous single low bandgap dielectric layer 270 is formed to be extended under one top electrode 260 and another top electrode 260 without a break. In other words, it can be seen that no isolation break is formed in the low bandgap dielectric layer 270 disposed between the top electrode 260 and the neighboring another top electrode 260. The low bandgap dielectric layer 270 includes an inclination zone first inclination zone 273*a* and a flat zone 273*b*.

According to the present disclosure as described above, a semiconductor device having a high-voltage isolation capacitor and a method for manufacturing the same in accordance with one or other examples is characterized by that a low bandgap dielectric layer for providing a high-voltage isolation is formed in the high-voltage isolation capacitor and the low bandgap dielectric layer is absent in the mixed-signal integrated circuit.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor device comprising a high-voltage isolation capacitor and a mixed-signal integrated circuit, wherein the high-voltage isolation capacitor comprises:
- bottom electrodes, each spaced apart from another, disposed on a substrate;
- top electrodes disposed on corresponding ones of the bottom electrodes;
- an inter-metal dielectric layer disposed between the bottom electrodes and the top electrodes; and
- low bandgap dielectric layers disposed on the inter-metal dielectric layer,

- wherein each of the low bandgap dielectric layers is disposed below corresponding ones of the top electrodes, and the low bandgap dielectric layers are absent in the mixed-signal integrated circuit,
- wherein the mixed-signal integrated circuit comprises:
  - a bottom metal line disposed adjacent the bottom electrodes;
  - an inter-metal line disposed on the bottom metal line;
  - a via connected to the inter-metal line; and
  - a top metal line connected with the via,
- wherein the low bandgap dielectric layers are absent below the top metal line, and
- wherein a bottom surface of the top metal line is disposed lower than a bottom surface of each of the top electrodes.

2. The semiconductor device of claim 1, further comprising a passivation layer disposed in direct contact with the low bandgap dielectric layers and the top electrodes.

3. The semiconductor device of claim 1, wherein a top surface of the via is coplanar with a bottom surface of a first sub-low bandgap dielectric layer of the low bandgap dielectric layers.

4. The semiconductor device of claim 3, wherein each of the low bandgap dielectric layers comprises:
- the first sub-low bandgap dielectric layer having a first thickness; and
- a second sub-low bandgap dielectric layer having a second thickness greater than the first thickness.

5. The semiconductor device of claim 1,
- wherein the bottom surface of the top metal line is disposed lower than a top surface of the via.

6. The semiconductor device of claim 1, wherein each of the low bandgap dielectric layers has a bandgap lower than a bandgap of the inter-metal dielectric layer.

7. A semiconductor device comprising a high-voltage isolation capacitor and a mixed-signal integrated circuit, wherein the high-voltage isolation capacitor comprises;
- bottom electrodes, each spaced apart from another, disposed on a substrate;
- top electrodes disposed on corresponding ones of the bottom electrodes;
- an inter-metal dielectric layer disposed between the bottom electrodes and the top electrodes; and
- a low bandgap dielectric layer disposed between the inter-metal dielectric layer and each one of the top electrodes,
- wherein the low bandgap dielectric layer is absent in the mixed-signal integrated circuit,
- wherein the mixed-signal integrated circuit comprises:
  - a bottom metal line disposed adjacent the bottom electrodes;
  - an inter-metal line disposed on the bottom metal line;
  - a via connected to the inter-metal line; and
  - a top metal line connected with the via, and
- wherein a bottom surface of the top metal line is disposed lower than a bottom surface of each of the top electrodes.

8. The semiconductor device of claim 7, wherein the bottom surface of the top metal line is disposed lower than a top surface of the via.

9. The semiconductor device of claim 7, wherein the low bandgap dielectric layer comprises:
- a first sub-low bandgap dielectric layer having a first thickness; and
- a second sub-low bandgap dielectric layer having a second thickness greater than the first thickness.

10. A semiconductor device, comprising:

a mixed-signal integrated circuit region; and a high-voltage isolation capacitor region, comprising:

bottom electrodes, each spaced apart from another, disposed on a substrate;

top electrodes disposed on corresponding ones of the bottom electrodes;

an inter-metal dielectric layer disposed between the bottom electrodes and the top electrodes; and low bandgap dielectric layers, each disposed between corresponding ones of the top electrodes and the inter-metal dielectric layer, wherein the mixed-signal integrated circuit region comprises a top metal line disposed directly on the inter-metal dielectric layer, wherein the mixed-signal integrated circuit region further comprises:

a bottom metal line disposed adjacent the bottom electrodes;

an inter-metal line disposed on the bottom metal line; and a via connected to the inter-metal line, wherein the top metal line is connected with the via, and wherein a bottom surface of the top metal line is disposed lower than a bottom surface of each of the top electrodes.

11. The semiconductor device of claim 10, further comprising a passivation layer disposed in direct contact with the low bandgap dielectric layers and the top electrodes.

12. The semiconductor device of claim 10, wherein a top surface of the via is coplanar with a bottom surface of a first sub-low bandgap dielectric layer of the low bandgap dielectric layers.

13. The semiconductor device of claim 12, wherein each of the low bandgap dielectric layers comprises:

the first sub-low bandgap dielectric layer having a first thickness; and a second sub-low bandgap dielectric layer having a second thickness greater than the first thickness.

14. The semiconductor device of claim 10, wherein the bottom surface of the top metal line is disposed lower than a top surface of the via.

15. The semiconductor device of claim 10, wherein each of the low bandgap dielectric layers has a bandgap lower than a bandgap of the inter-metal dielectric layer.

* * * * *